Aug. 30, 1960 H. V. BUCK 2,951,185

PRINTED CIRCUIT SUBASSEMBLIES AND TEST FIXTURES

Filed Dec. 28, 1956

INVENTOR.
HARRY V. BUCK

BY

T. L. Styner

ATTORNEY

United States Patent Office 2,951,185
Patented Aug. 30, 1960

2,951,185

PRINTED CIRCUIT SUBASSEMBLIES AND TEST FIXTURES

Harry Victor Buck, Rochester, N.Y., assignor to General Dynamics Corporation, Rochester, N.Y., a corporation of Delaware Filed Dec. 28, 1956, Ser. No. 631,325

2 Claims. (Cl. 317—101)

Figures 1, 2, 3:
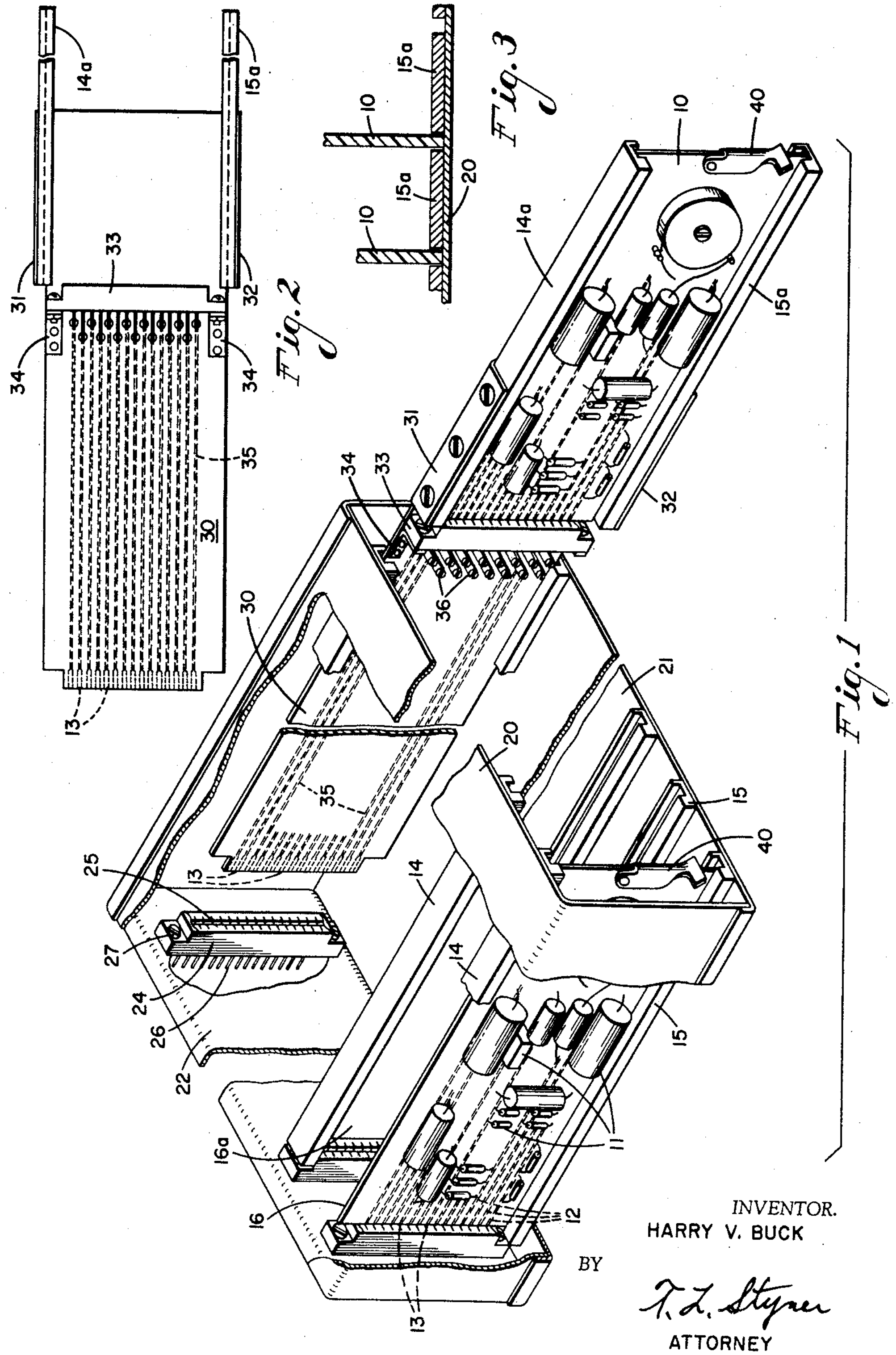

This invention relates to cabinets and is particularly directed to mountings for subassemblies of electrical equipment, with a view to low-cost manufacture and easy servicing while in use.

Chassis layouts for electrical equipment becomes more complex as the circuits of the equipment become more complex. For purposes of manufacture and servicing, it has been proposed that components be judiciously grouped and separately packaged, and plug and socket connectors be used for bringing these packages or "modules" into cooperative electrical relation. While such a technique in chassis arrangement facilitates the isolation of defective components and rapid servicing, costs of manufacture has not benefited. In equipment having large numbers of similar, or repetitive, subassemblies, as in telephone stations, standardization and low-cost manufacture has not heretofore been seriously attempted.

An object of this invention is to provide an improved chassis and cabinet structure for electrical equipment.

A more specific object of this invention is to provide an improved chassis layout for repetitive subassemblies of electrical components which is low in cost of manufacture and yet is easy to maintain in use and to service.

The objects of this invention are attained by mounting the electrical components of a complete unitary subassembly on one side of a rectangular printed circuit board, on the other side of which is printed the electrical connections between the components and printed male terminals along one end edge of the board. The side edges of the boards are then slid into pairs of ways secured in close spaced parallel relation in a supporting structure, such as a rectangular box. A multiple-contact in-line female socket is disposed between the ends of each pair of ways to receive the in-line printed male terminals, so that by sliding a board in its ways, the assembly of components on the board may be connected into or disconnected from operative relation with the equipment. A test fixture permits physical removal of any subassembly without disconnection of the circuits for easy servicing.

The principles of this invention will become apparent by referring to the specific embodiment described in the following specification and shown in the accompanying drawing in which Fig. 1 is a partly sectioned perspective view of an electrical cabinet embodying this invention, Fig. 2 is a planned view of a test fixture shown in perspective in Fig. 1, and Fig. 3 is a detail of an alternative way.

A plurality of assemblies of electrical components are mounted, respectively, on printed circuit boards 10, 10*a*, et cetera. Each board is a flat rectangular sheet of insulation having good electrical properties and is relatively stiff. For example, fiberglass cloth impregnated with a thermoplastic such as "Teflon," may be rolled to thickness of about 1/16" and cut into various rectangular sizes and yet carry considerable weight without flexing.

The area of the board is adjusted to provide ample room for all of the components of a preselected list of components for a subassembly. In Fig. 1, the components are mounted on one side only of the board 10, although the components could, of course, be mounted on both sides. The components indicated generally at 11 comprise the usual resistors, conductors, coils, transistors and the like, making up the complete subassembly. Preferably each component has a lead-in wire at opposite ends thereof which are bent at right angles to the body of the component and passed through punched holes in the board. The protruding ends of the leads are trimmed to length and crimped to anchor the components in place. Circuit connections are then made to the lead-in wires by printed circuits, solder preferably being used to make an electrical and mechanical bond between the crimped leads and the printed circuits.

The printed circuits may be preformed on the reverse side of each board by any of several techniques. One satisfactory method comprises cladding the entire surface of the board with a copper laminate, spreading a varnish-like photo-resist over the cleaned copper, irradiating selected portions of the coated copper with strong light through a negative of the desired circuitry, washing away the unfixed portions of the photo-resist and finally removing the unexposed portions of the copper in an etching bath. The printed circuit conductors are generally indicated in Fig. 1 by the reference number 12.

According to an important and characteristic feature of this invention, the printed circuits 12 all terminate in printed terminals 13, evenly spaced along one end edge of the board. All circuit connections to the components 11 on the board are made through the printed terminals 13. The printed terminals are preferably formed on the board along with the printed circuits. Extra weight and thickness may be given to the terminals, if desired, by wetting the terminals with hard solder.

According to the next important feature of this invention, the boards 10 are mounted in close spaced parallel relation with only enough distance between the parallel boards to provide the necessary headroom for the largest component. The side edges of each board are slidably held in two ways 14 and 15. In the example shown, the ways comprise elongated metal channel strips, each with a groove sufficiently wide to receive, without binding, the side edges of the boards. Likewise, the distance between each pair of ways is fixed to accurately guide each board without binding.

A rigid unitary structure is provided for supporting the several pairs of ways, the preferred structure comprising a rectangular box as shown with top and bottom panels 20 and 21 and rear panel 22. The box is economically fabricated from sheet metal of sufficiently heavy gauge to hold the ways in relatively rigid parallel relation. The dimensions of the box are, of course, adjusted to accommodate the length and breadth of the panel boards and to receive the desired number of boards. Good results have been obtained in making the box sufficiently long across the front to receive 9 boards spaced about 1¼" apart.

According to the next feature of this invention, a straight in-line socket is mounted between the rear ends of each pair of ways. The sockets each comprise the body 24 of insulating material, such as molded plastic, and holding aligned contact elements 25. Each contact element 25, not shown in detail, is formed integrally with an external lug 26 extending through cut-out windows in the rear wall 22 of the box. The width and spacing of the contact elements 25 are adjusted to make individual connections with the printed terminals 13 when the boards are slid in place and pressed home. To facilitate alignment of the socket with the printed terminals, stove bolts or commercially obtainable retaining pins 27 with snap rings may be passed through oversized holes in the socket or chassis metal to permit limited floating and self-centering of the socket. The contact elements 25 are shown as being of the female type to receive the male terminals 13, although this male and female contact arrangement could, if desired, be reversed. With a rigid unitary box structure of the type shown, the position of the sockets 24 are easily fixed for exact registry of the male and female connectors.

Alternatively, the ways could be formed by fastening, as by spot welding, metal strips **14*a*, 15*a* to the top and bottom panels of the box. As shown in Fig. 3, the strips are of a width corresponding to the desired spacing, face-to-face, between the printed circuit boards. One advantage of the Fig. 3 construction resides in the low-cost manufacture. All parts, including the spacer strips 14*a*, 15*a***, may be stamped from stock, without the necessity of machining or milling operations.

Cable harness not shown is carried across the rear of the box structure and appropriate connections are made to the lugs 26 of each socket. The remote end of the cable extends to the electrical equipment in which the printed circuit boards are to function.

The components on each board are closely assembled to provide maximum use of space on each board, yet provide an open assembly which is easy to inspect and repair. Further, the boards are close spaced to provide maximum volumetric space for a given number of circuits. The components thus divided among the boards of the cabinets and spread over the face of each board permit easy and effective cooling.

It will be noted, however, that a defective component or circuit on any one board cannot easily be found or repaired because of the lack of space between the boards. According to another important feature of this invention, a test fixture is provided for physically removing a suspected board from its place in the cabinet and then returning the board electrically to the circuit for test purposes. The fixture comprises the board 30 of the same width as boards 10 and with printed test terminals 13 at one end just as in the case of boards 10. The other end of the test board 30 is extended and attached to brackets 31 and 32 to which are affixed ways **14*a* and 15*a*. Across the ends of the ways 14*a* and 15*a* are fastened the socket 33, by brackets 34, in the same spaced relation as the sockets 24 and ways 14—15 of the cabinet. Each printed terminal 13 is connected by printed circuits 35 to the corresponding lugs 36 of socket 33. The length of test board 30 is sufficient to place socket 33 outside the cabinet when the printed terminals 13 are pressed home in socket 24. The defective board 10 is then slid into ways 14*a*—15*a* until the printed terminals engage the contactors of socket 33. Whereupon, all potentials at socket 24 are applied to the components of the board 10** under test and test probes may be applied to the now exposed components and the necessary servicing procedures followed. The equipment of Fig. 1 becomes its own test equipment, according to this invention. The speed with which a large number of boards may be tested materially aids in servicing.

By judicious selection of components for their small head-room height above the surface of the printed circuit board, the required spacing between the parallel boards can be kept small, and large quantities of equipment can be housed in small boxes. The spacing between boards has in practice been so reduced that there is insufficient room for the service personnel to insert their fingers for removal of the boards. Small hinged handles 40, of light sheet metal, have been attached to each board for hand grip. The handle hangs out of the way when not in use.

Many modifications may be made in this invention by those skilled in the art without departing from the scope of the invention as defined in the following claims.

What is claimed is:

1. The combination of a plurality of printed circuit boards carrying components electrically connected to terminals along one edge of the board; a unitary structure for supporting said boards in close spaced parallel relation; electrical sockets in said structure for receiving said terminals on the boards when the boards are in operative position; and a fixture for testing each printed circuit board comprising a test board with male and female connectors, respectively, at opposite ends of the test board and electrically connected together, the connector at one end of the test board being adapted to said sockets, and means at the other end of said test board for receiving and holding one of said printed circuit boards in the connector at said other end so that a printed circuit board is electrically connected to its socket although physically removed therefrom.

2. A plurality of rectangular circuit boards in close spaced parallel relation, electrical components mounted on each board and connected to terminals along one edge of each board, a plurality of parallel in-line sockets adapted to receive said terminals of the boards, and a plurality of pairs of channeled ways slidably engaging the side edges of the boards, the ends of the ways of each pair being disposed and fixed opposite the ends of the sockets, respectively, a test fixture for physically removing any one selected board from among said boards for examination without electrically disconnecting the board from its socket, said fixture comprising a test board substantially of the dimensions of said circuit boards and having male and female connectors at opposite ends, and having means for holding said one circuit board in one of said connectors.

References Cited in the file of this patent

UNITED STATES PATENTS

| | | |
|---|---|---|
| 2,701,346 | Powell | Feb. 1, 1955 |
| 2,731,609 | Sobell | Jan. 17, 1956 |
| 2,754,453 | Noel | July 10, 1956 |
| 2,807,789 | McCann | Sept. 24, 1957 |
| 2,832,013 | Pederson et al. | Apr. 22, 1958 |
| 2,841,660 | Tabet | July 1, 1958 |
| 2,844,807 | McMulkin | July 22, 1958 |
| 2,862,992 | Franz | Dec. 2, 1958 |

FOREIGN PATENTS

| | | |
|---|---|---|
| 357,171 | Great Britain | Sept. 10, 1931 |
| 856,155 | France | June 3, 1940 |
| 203,624 | Australia | Oct. 10, 1956 |